United States Patent [19]
Garner

[11] Patent Number: 6,162,989
[45] Date of Patent: Dec. 19, 2000

[54] CABLE ENTRY SHIELD (EMI-RFI) FOR ELECTRONIC UNITS

[75] Inventor: Robin E. Garner, Glendale, Ariz.

[73] Assignee: Honeywell Inc, Morristown, N.J.

[21] Appl. No.: 09/100,957

[22] Filed: Jun. 22, 1998

[51] Int. Cl.$^7$ ....................................... H05K 9/00
[52] U.S. Cl. .................. 174/35 R; 174/48; 174/52.1; 174/65 R; 439/610; 439/701; 361/826; 361/829; 361/729
[58] Field of Search ..................... 174/35 R, 48, 174/52.1, 65 R; 439/610, 701; 361/826, 829, 729

[56] References Cited

U.S. PATENT DOCUMENTS 5,693,908  12/1997  Amberger .................................. 174/48
5,750,923  5/1998  Wu ........................................ 174/35 R
5,867,372  8/1999  Shie ........................................ 361/826
5,895,292  4/1999  Affeltrnager ........................... 439/610

Primary Examiner—William A. Cuchlinski, Jr.
Assistant Examiner—Ronnie Mancho
Attorney, Agent, or Firm—Robert J. Black; Anthony Miologos

[57] ABSTRACT

Apparatus for providing EMI/RFI shielding to cables connected between electrical circuitry contained within an enclosure and the exterior environment. A fixed supporting flange is secured to the enclosure adjacent to a gap in the enclosure. An adjustable compression flange is secured to the enclosure adjacent to the gap. Cables extending from inside of the enclosure to the exterior environment pass through the gap. A compliant, resilient gasket is positioned over the gap, between the supporting flange and the compression flange. The compression flange bearing against the cables compresses the cables into the gasket.

7 Claims, 1 Drawing Sheet

CABLE ENTRY SHIELD (EMI-RFI) FOR ELECTRONIC UNITS

BACKGROUND OF THE INVENTION

1. Field of the Invention

The present invention relates to cable interfacing to electronic chassis. More particularly, the present system relates to an electromagnetic and radio-frequency interference (EMI/RFI) cable entry shield for use with personal computers, electronic cabinets and similar structures.

2. Background Art

The present invention overcomes some of the problems inherent in previous approaches to providing cable interface to electronic chassis. One of these techniques is that of cable bulkheading which involves intermediate connectorization in the cable at the point where it passes through the boundary of the electronic chassis or enclosure.

The obvious cost and difficulty of installing such techniques is apparent because of the intermediate connectorization which requires special units designed to inhibit electromagnetic and radio-frequency interference.

Another technique is that of the method of interleaved flanges or the use of a wave guide below cutoff. In this arrangement, two members with a "Z"-shaped cross-section are oriented parallel to each other and sufficiently close so as to form a "torturous path". The opening thus formed permits cables carrying the desired signals to be routed through. Hopefully, this is impenetrable to most unwanted signals associated with externally generated interference except those at high frequency. High frequency, for the present purpose, implies those signals which are a quarter wavelength less than the largest effective dimension of the opening created with the "Z"-shaped cross-section units.

A search of the background art directed to the subject matter of the present invention conducted in the U.S. Patent and Trademark Office disclosed the following U.S. Letters Pat. Nos.:

5,107,071 5,202,536
5,170,321 5,204,496
5,194,691 5,665,937

U.S. Pat. No. 5,107,071 discloses a sealing and shielding structure comprising an elastic sealing member and an electromagnetic shielding member provided in a cavity formed between first and second members which have conductive abutting faces. No facility for the introduction or passage of cables through the structure are disclosed.

U.S. Pat. No. 5,170,321 discloses an enclosure system including a conductive cover shield retained in contact with a substrate having a radio frequency (RF) circuit disposed thereon. Again, no facility for passage of cables or conductors through the enclosure to the exterior are disclosed.

U.S. Pat. No. 5,194,691 discloses a device for providing EMI/RFI shielding for a joint in a cabinet structure that includes a compressible, resilient sealing element and a conductive shielding element bonded to the sealing element and positioned so that the shielding element provides a direct electrical contact across the joint. The shielding arrangement is intended for a cabinet designed to particularly utilize the compressible resilient sealing element. It is also intended to minimize paths by which moisture and debris may enter the cabinet interior. No facility for the passage of cables through the cabinet joints or other shielding means are taught.

U.S. Pat. No. 5,202,536 also teaches a seal for blocking propagation of electromagnetic energy through a gap between bodies having conductive surfaces adjacent to the gap. The invention teaches that the gap includes an elongated core element defining a resiliently compressible cross section which can be molded, extruded or otherwise formed. No facility for the passage of cables through the seal is anticipated by this patent.

U.S. Pat. No. 5,204,496 teaches an EMI shielding gasket made of springy electrically conductive material. The gasket includes a pair of generally parallel laterally spaced apart U-shaped channel members each with its channel entrance facing away from the other member. A pair of ends oriented transversely of the U-shaped channel members connect the members together at their end regions. The ends are resiliently deformable to allow the U-shaped channel members to be moved more closely together to facilitate mounting the gasket. The gasket is usually made of a single piece of metal. No facility for inclusion or passage of cables through the gasket area is taught.

U.S. Pat. No. 5,665,937 features a strain relief bulkhead that provides EMI shielding for data cables being inserted into cabinets by means of the inclusion of a conductive vise, slidably mounted on a stationary guide track permanently attached to a bracket made of conductive material to which a conductive cover panel is removably fastened. A screw mechanism is included to provide an impelling motion for the conductive vise. The vise is moved against the data cables compressing the data cables into contact with each other and with the conductive bracket. A cover panel provides some EMI shielding for the data cables. The conductive bracket, the conductive guide track, the conductive vise, and the cover panel are all made of steel in a preferred embodiment.

A thorough review of the above-identified patents has concluded that none are believed to claim, teach, or disclose the particular novel combination of elements and functions set forth in the present invention. Accordingly, it is the object of the present invention to provide an improved cable entry shielding arrangement that permits multiple cables of varying diameters and stiffness to pass through the boundary of an electronic chassis while minimizing the area of cable passage openings. The resultant reduction in cable passage openings is typically significantly smaller than those associated with prior art techniques. This arrangement is highly desirable inasmuch as in high frequency applications large openings are typically highly detrimental to EMI/RFI shielding effectiveness.

SUMMARY OF THE INVENTION

The present invention achieves the above object by providing a design that is effective to reduce radiated susceptibility and emissions where various connecting cables pass through the boundary of a chassis or enclosure. This technique provides both an effective means for mounting an electromagnetic compatible barrier between the electronics contained within a housing and the environment. The arrangement taught is particularly effective in reducing high frequency radiated emissions and susceptibility to such signals from the surrounding environment.

The invention consists effectively of two flanges, or lips, fastened to the electronics housing or chassis. One of the lips is permanently affixed to the chassis, while the second is adjustably secured thereto and may be moved in a direction toward the fixed flange. Both provide a right angle portion between which is introduced a compliant EMI/RFI gasket material. Cables or conductors are passed between the two flanges and compressed by the bracket against the compliant gasket material by means of the adjustable flange unit. When the adjustable angle is brought in contact with the compliant gasket material and the cables, it compresses the cables into the gasket until the gasket contacts the upper or adjustable lip, after which the adjustable bracket is secured mechanically and electrically to the enclosure, and locked into position by included fastening means. Such compliant EMI/RFI gasket material is well known and is commercially available.

Accordingly, it is the object of the present invention to provide an enclosure that reduces radiated susceptibility to signals and emissions where various connecting cables pass through the boundary of an enclosure providing mounting as well as an electromagnetic compatible (EMC) barrier between the electronics and the environment. Note that this invention has been found to be particularly effective in reducing high frequency radiated susceptibility and emissions. The particular arrangement taught allows various power and signal cables of different sizes to pass through a chassis structure with minimum degradation to its EMI/RFI shielding effectiveness and with no intermediate electrical connection as required in the prior art.

BRIEF DESCRIPTION OF THE DRAWING

The preferred embodiment of the present invention will be describing in detail with reference to the accompanying drawing where.

DETAILED DESCRIPTION OF THE PREFERRED EMBODIMENT

Figure 1:
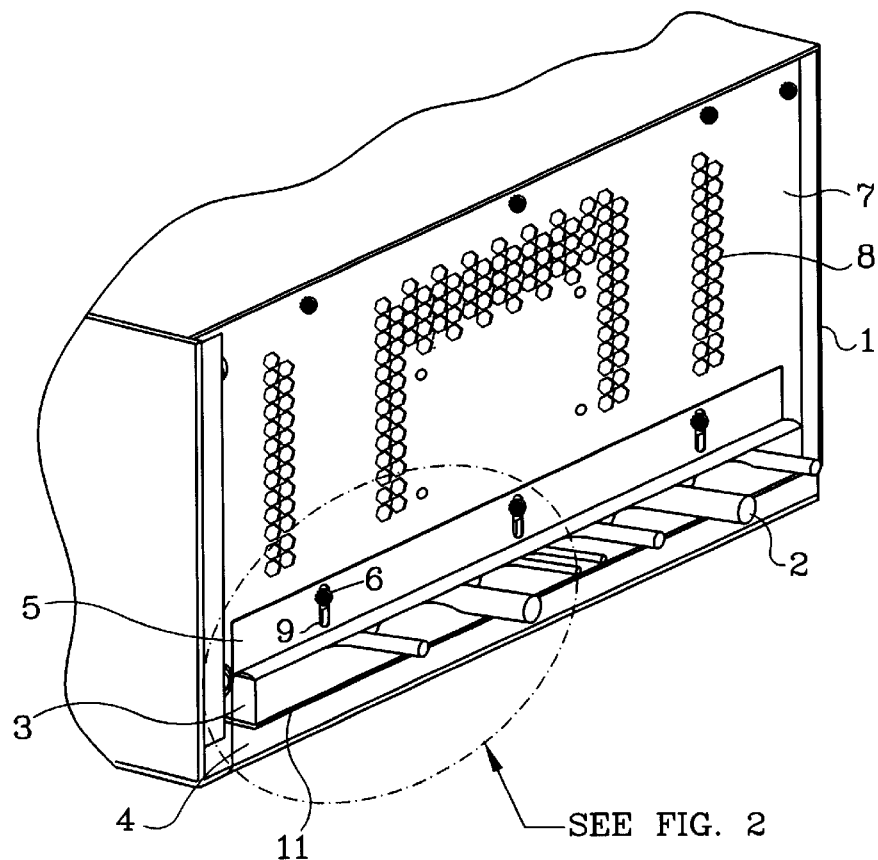
FIG. 1 is a partial, perspective view of an electronic unit or enclosure adapted to pass cables from the interior thereof to the exterior utilizing the teachings of the present invention.
Figure 2:
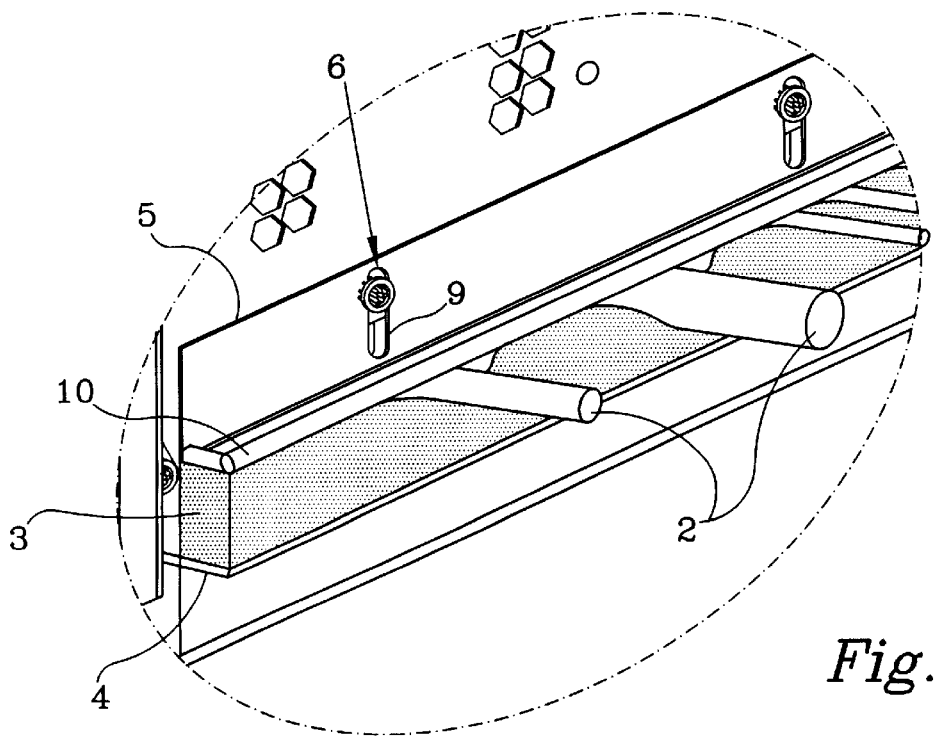
FIG. 2 is an enlarged perspective view of a portion of FIG. 1 showing in greater detail the gasket, cables, and brackets utilized for securing and monitoring the gasket material in accordance with the present invention.

Referring now to FIGS. 1 and 2, an enclosure 1 is shown having a rear panel 7. Included in the rear panel 7 are a number of vent holes 8 which do not form a portion of the present invention. Shown on the rear of enclosure 1, in addition to rear panel 7, is a first or supporting flange or lip 4 which is fixedly secured to the rear of the enclosure. Positioned above, some distance apart from flange or lip 4, is a second or compression flange or lip 5, having a rounded edge 10 thereon. It is noted that flange 5 has a number of openings 9 which are elongated and provide a certain amount of adjustment by means of fasteners 6 which project through flange 5 and secure the flange to the rear panel 7. Electrical connection is required of both flanges 4 and 5 to the enclosure 1, either directly or via back panel 7. It is to be understood but not seen because of the presence of compliant gasket 3 that a gap extends across the enclosure beneath rear panel 7. It is through this gap that cables, such as 2, project from the electronic equipment included internally within enclosure 1 to the exterior environment. As can be readily seen from referring to FIG. 2, gasket material 3 surrounds the cables such as 2 and in response to adjustment of compression flange 5 in a direction toward supporting flange 4, cables 2 are forced into the compliant gasket material 3. When flange 5 is moved against cables 2 in a direction toward flange 4, effective EMI/RFI shielding is provided around the cables and also provides some shielding across the gap that extends behind compliant gasket 3.

It is to be understood that the first and second flanges are constructed of metal or some other electrically conductive material effectively being connected or grounded electrically to the enclosure 1, or as in the case of flange 5 to rear panel 7. Gasket 3, located between flanges 4 and 5 and surrounding cables 2, is constructed of a resilient, compliant plastic or foam-like material which includes an electrically conductive component which facilitates providing adequate shielding for cables 2. Said compliant gasket constructed of EMI/RFI gasket material is readily available commercially under a variety of different names. It can be seen that the compliant gasket 3 provides electrical connection between said first and second flanges 4 and 5, respectively. It will be obvious from the foregoing, that adjustment of the second flange in a downward direction toward said first flange to bear against said cable 2, compresses said cable into the compliant gasket material effectively providing the gasket structure with minimum degradation to its EMI/RFI shielding effectiveness and no intermediate electrical interconnection of the cables is required.

While but a single embodiment of the present invention has been shown, it will be obvious to those skilled in the art that numerous modifications can be made without departing from the spirit of the present invention, which shall be limited only by the scope of the claims appended hereto.

What is claimed is:

1. Apparatus for providing EMI/RFI shielding to at least one cable connected between electrical circuitry contained within the interior of an enclosure and the environment exterior to said enclosure, said apparatus comprising:

a supporting flange fixedly secured to said enclosure adjacent to a gap, said gap extending into the interior of said enclosure;

a compression flange adjustably secured to said enclosure adjacent to said gap, said adjustment of said compression flange being in a downward direction of travel toward said supporting flange;

said at least one cable extending from said interior of said enclosure to said exterior environment through said gap;

a compliant, resilient gasket located between said supporting flange and said at least one cable;

whereby in response to said compression flange bearing against said at least one cable, said at least one cable is compressed into said gasket.

2. Apparatus as claimed in claim 1 wherein:

said compression flange is secured to said enclosure by a plurality of adjustment means.

3. Apparatus as claimed in claim 1 wherein:

said enclosure further includes a plurality of fastener receiving means, and said compression flange includes a plurality of elongated openings arranged to receive a plurality of fastening means, each fastening means passing through a respective one of said plurality of elongated openings to engage a respective one of said fastener receiving means, allowing said compression flange to be adjusted in a downward direction of travel toward said supporting flange thereby providing said adjustable securing of said compression flange to said enclosure and further providing the necessary electrical connection to ensure EMI/RFI shielding of said cables.

4. Apparatus as claimed in claim 1 wherein:

said supporting flange and said compression flange are each constructed of an EMI/RFI shielding material and are each electrically connected to said enclosure.

5. Apparatus as claimed in claim 1 wherein:

said compliant gasket is constructed of EMI/RFI gasket material.

6. Apparatus as claimed in claim 1 wherein:

said compliant gasket provides electrical connection between said supporting and said compression flanges.

7. Apparatus as claimed in claim 3 wherein:

said adjustment of said compression flange causes said compression flange to bear against said at least one cable, compressing said at least one cable into said compliant gasket.

* * * * *

UNITED STATES PATENT AND TRADEMARK OFFICE
CERTIFICATE OF CORRECTION

PATENT NO. : 6,162,989
DATED : December 19, 2000
INVENTOR(S) : Robin E. Garner

Page 1 of 1

It is certified that error appears in the above-identified patent and that said Letters Patent is hereby corrected as shown below:

<u>Title page,</u>
Item [75], Inventor: Add

-- Robert Golbach, Litchfield Park, AZ --

Item [19] add -- , et al --

Signed and Sealed this

Thirtieth Day of October, 2001

Attest:

*Nicholas P. Godici*

NICHOLAS P. GODICI
*Attesting Officer*   *Acting Director of the United States Patent and Trademark Office*